(12) United States Patent
Yang et al.

(10) Patent No.: US 9,613,984 B2
(45) Date of Patent: Apr. 4, 2017

(54) DISPLAY DEVICE, METHOD OF FABRICATING THE SAME, AND METHOD OF FABRICATING IMAGE SENSOR DEVICE

(71) Applicant: Electronics and Telecommunications Research Institute, Daejeon (KR)

(72) Inventors: Jong-Heon Yang, Daejeon (KR); Jonghyurk Park, Daejeon (KR); Chunwon Byun, Yongin-si (KR); Chi-Sun Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 103 days.

(21) Appl. No.: 14/446,394

(22) Filed: Jul. 30, 2014

(65) Prior Publication Data

US 2015/0214250 A1    Jul. 30, 2015

(30) Foreign Application Priority Data

Jan. 27, 2014   (KR) ........................ 10-2014-0009757

(51) Int. Cl.
*H01L 27/12*   (2006.01)
*H01L 27/14*   (2006.01)
(Continued)

(52) U.S. Cl.
CPC .......... *H01L 27/1225* (2013.01); *H01L 27/12* (2013.01); *H01L 27/124* (2013.01);
(Continued)

(58) Field of Classification Search
CPC .......... H01L 27/14609; H01L 27/1214; H01L 27/14689; H01L 29/66757; H01L 27/12;
(Continued)

(56) References Cited

U.S. PATENT DOCUMENTS 5,877,514 A * 3/1999 Seo .................... H01L 27/1214
257/350
6,808,965 B1 * 10/2004 Miyasaka .......... H01L 21/0262
257/E21.101
(Continued)

OTHER PUBLICATIONS

Guanghai Jin et al., "Simple Fabrication of a Three-Dimentional CMOS Inverter Using p-Type Poly-Si and n-Type Amorphous Ga—In—Zn—O Thin-Film Transistors", IEEE Electron Device Letters, vol. 32, No. 9, pp. 1226-1238, Sep. 2011.
(Continued)

*Primary Examiner* — Bac Au
(74) *Attorney, Agent, or Firm* — Rabin & Berdo, P.C.

(57) ABSTRACT

Provided are a display device, a method of fabricating the display device, and a method of fabricating an image sensor device. The method of fabricating the display device includes preparing a substrate including a cell array area and a peripheral circuit area, forming a silicon layer on the peripheral circuit area of the substrate, forming oxide layers on the cell array area and the peripheral circuit area of the substrate, forming gate dielectric layers on the silicon layer and the oxide layers, forming the gate electrodes on the gate dielectric layers, wherein the gate electrodes expose both ends of the silicon layer and both ends of the oxide layers, and injecting dopant into both ends of the silicon layer and both ends of the oxide layers at the same time.

12 Claims, 10 Drawing Sheets

(51) Int. Cl.
*H01L 27/146* (2006.01)
*H01L 27/32* (2006.01)
*H01L 29/66* (2006.01)

(52) U.S. Cl.
CPC ........ *H01L 27/127* (2013.01); *H01L 27/1214* (2013.01); *H01L 27/1259* (2013.01); *H01L 27/14* (2013.01); *H01L 27/1222* (2013.01); *H01L 27/14609* (2013.01); *H01L 27/14689* (2013.01); *H01L 27/32* (2013.01); *H01L 27/3241* (2013.01); *H01L 27/3244* (2013.01); *H01L 29/66757* (2013.01)

(58) Field of Classification Search
CPC ... H01L 27/124; H01L 27/14; H01L 27/1225; H01L 27/1222; H01L 27/127; H01L 27/32; H01L 27/3241; H01L 27/3244
See application file for complete search history.

(56) References Cited

U.S. PATENT DOCUMENTS

| | | | | |
|---|---|---|---|---|
| 6,818,922 B2* | 11/2004 | Chen | ................ | H01L 27/1288 257/66 |
| 8,692,750 B2* | 4/2014 | Lee | ................ | G02F 1/13454 345/178 |
| 8,999,823 B2* | 4/2015 | Makita | ................ | H01L 27/12 438/487 |
| 2003/0092224 A1* | 5/2003 | Hwang | ................ | H01L 27/1214 438/151 |
| 2007/0040174 A1* | 2/2007 | Kim | ................ | H01L 27/1214 257/59 |
| 2010/0006837 A1 | 1/2010 | Cho et al. | | |
| 2010/0176395 A1* | 7/2010 | Choi | ................ | H01L 27/12 257/43 |
| 2011/0037729 A1* | 2/2011 | Cho | ................ | G06F 3/0412 345/175 |
| 2011/0133178 A1* | 6/2011 | Yamazaki | ................ | H01L 27/1225 257/43 |
| 2011/0204371 A1 | 8/2011 | Kozuma et al. | | |
| 2012/0090676 A1* | 4/2012 | Lin | ................ | H01L 31/075 136/255 |
| 2013/0078787 A1* | 3/2013 | Nakatsuji | ................ | H01L 21/04 438/510 |
| 2014/0051238 A1* | 2/2014 | Saitoh | ................ | H01L 27/1288 438/510 |
| 2014/0159038 A1* | 6/2014 | Im | ................ | H01L 27/1225 257/43 |

OTHER PUBLICATIONS

Christophe Avis et al., "Coplanar ZnO Thin-Film Transistor Using Boron Ion Doped Source/Drain Contacts", Electrochemical and Solid-State Letters, vol. 12, pp. J93-J95, Jul. 2009.

* cited by examiner

DISPLAY DEVICE, METHOD OF FABRICATING THE SAME, AND METHOD OF FABRICATING IMAGE SENSOR DEVICE

CROSS-REFERENCE TO RELATED APPLICATIONS

This U.S. non-provisional patent application claims priority under 35 U.S.C. §119 of Korean Patent Application No. 10-2014-0009757, filed on Jan. 27, 2014, the entire contents of which are hereby incorporated by reference.

BACKGROUND OF THE INVENTION

The present invention disclosed herein relates to a transistor, and more particularly, to a transistor for a display device or a transistor for an image sensor device.

Transistors are being widely used for many purposes in various electronic equipments. For example, transistors may be used for switching devices, driving devices, and photo sensing devices. Furthermore, the transistors may be used as components of various electronic circuits.

When such a display device includes a transistor formed of amorphous silicon, the display device may be easily fabricated. However, the display device may be deteriorated in performance. When such a display device includes a transistor formed of polysilicon, the display device may have superior performance. However, the display device may be complicated in fabrication process.

SUMMARY OF THE INVENTION

The present invention provides a high-integrated display device having high resolution.

The present invention also provides a method of fabricating a high-integrated display device having high resolution.

The present invention also provides a method of fabricating an image sensor device having high sensitivity.

The object of the present invention is not limited to the aforesaid, but other objects not described herein will be clearly understood by those skilled in the art from descriptions below.

Embodiments of the present invention provide display devices including: a substrate including a cell array area and a peripheral area; an n-type transistor disposed on the cell array area of the substrate; and a CMOS transistor disposed on the peripheral area of the substrate, wherein the CMOS transistor includes: an NMOS transistor including a circuit oxide layer, a first circuit gate dielectric layer disposed on the circuit oxide layer, and a first circuit gate electrode disposed on the first circuit gate dielectric layer; and a PMOS transistor including a silicon layer, a second circuit gate dielectric layer disposed on the silicon layer, and a second circuit gate electrode disposed on the second circuit gate dielectric layer.

In some embodiments, the circuit oxide layer may include source/drain areas and a channel area, the silicon layer may include source/drain electrodes and an active area, and the source/drain areas of the circuit oxide layer may include the same dopant as the source/drain electrodes of the silicon layer.

In other embodiments, the n-type transistor may include a cell oxide layer including source/drain parts and a channel part, a cell gate dielectric layer disposed on the cell oxide layer, and a cell gate electrode disposed on the cell gate dielectric layer, and the cell oxide layer may include the same material as the circuit oxide layer.

In still other embodiments, the cell oxide layer may include at least one of Zn, In, Sn, and Ga.

In even other embodiments, the cell gate dielectric layer may include the same material as the first circuit gate dielectric layer and the second circuit gate dielectric layer, and the cell gate electrode may include the same material as the first circuit gate electrode and the second circuit gate electrode.

In yet other embodiments, the dopant may include boron (B).

In further embodiments, the display devices may further include: an interdielectric layer disposed on the substrate to cover the silicon layer, the oxide layers, and the gate electrode; and conductive lines disposed on the interdielectric layer to respectively contact both ends of the circuit oxide layer, the first circuit gate electrode, and the second circuit gate electrode.

In other embodiments of the present invention, methods of fabricating a display device include: preparing a substrate including a cell array area and a peripheral circuit area; forming a silicon layer on the peripheral circuit area of the substrate; forming oxide layers on the cell array area and the peripheral circuit area of the substrate; forming gate dielectric layers on the silicon layer and the oxide layers; forming the gate electrodes on the gate dielectric layers, wherein the gate electrodes expose both ends of the silicon layer and both ends of the oxide layers; and injecting dopant into both ends of the silicon layer and both ends of the oxide layers at the same time.

In some embodiments, both ends of the silicon layers may have p-type conductive properties, and both ends of the oxide layers may have n-type conductive properties because of the injection of the dopant.

In other embodiments, the injection of the dopant may be performed by using a boron-containing gas or a boron-containing gas and a hydrogen mixed gas.

In still other embodiments, the dopant may include boron (B).

In even other embodiments, the silicon layer may not be formed on the cell array area.

In further embodiments, the methods may further include: forming an interdielectric layer disposed on the substrate to cover the silicon layer, the oxide layers, and the gate electrode; and forming conductive lines disposed on the interdielectric layer, wherein the conductive lines may contact both ends of the silicon layer, both ends of the oxide layers, and the gate electrode, respectively.

In still other embodiments of the present invention, methods of fabricating an image sensor device include: preparing a substrate including a first area and a second area; forming a silicon layer on the second area of the substrate; forming an oxide layer on the substrate, wherein the oxide layer extends from the first area of the substrate to the silicon layer; patterning the oxide layer to form a first oxide layer and a second oxide, wherein the first oxide layer is disposed on the first area of the substrate, the second oxide layer is disposed on the silicon layer, and one end of the silicon layer is exposed; forming a gate dielectric layer on the first oxide layer; forming a gate electrode on the gate dielectric layer, wherein the gate electrode exposes both ends of the first oxide layer; and injecting dopant into both ends of the first oxide layer, an upper portion of the second oxide layer, and the one end of the silicon layer at the same time.

In some embodiments, the injection of the dopant may include: forming source/drain areas on both ends of the first oxide layer; forming an n-type dopant area on the upper portion of the second oxide layer; and forming a p-type dopant area on the one end of the silicon layer.

In other embodiments, each of the n-type dopant area and the source/drain areas may include boron (B).

In still other embodiments, the injection of the dopant may be performed by using a boron-containing gas or a boron-containing gas and a hydrogen mixed gas.

In even other embodiments, the methods may further include: forming an interlayer disposed on the substrate to cover the silicon layer, the oxide layers, and the gate electrode; and wherein the conductive lines contact both ends of the silicon layer, both ends of the oxide layers, and the gate electrode, respectively.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present invention. The terms of a singular form may include plural forms unless referred to the contrary. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. Like reference numerals refer to like elements throughout.

Unless terms used in embodiments of the present invention are differently defined, the terms may be construed as meanings that are commonly known to a person skilled in the art.

Hereinafter, a display device according to the present invention will be described with reference to the accompanying drawings.

Figure 1:
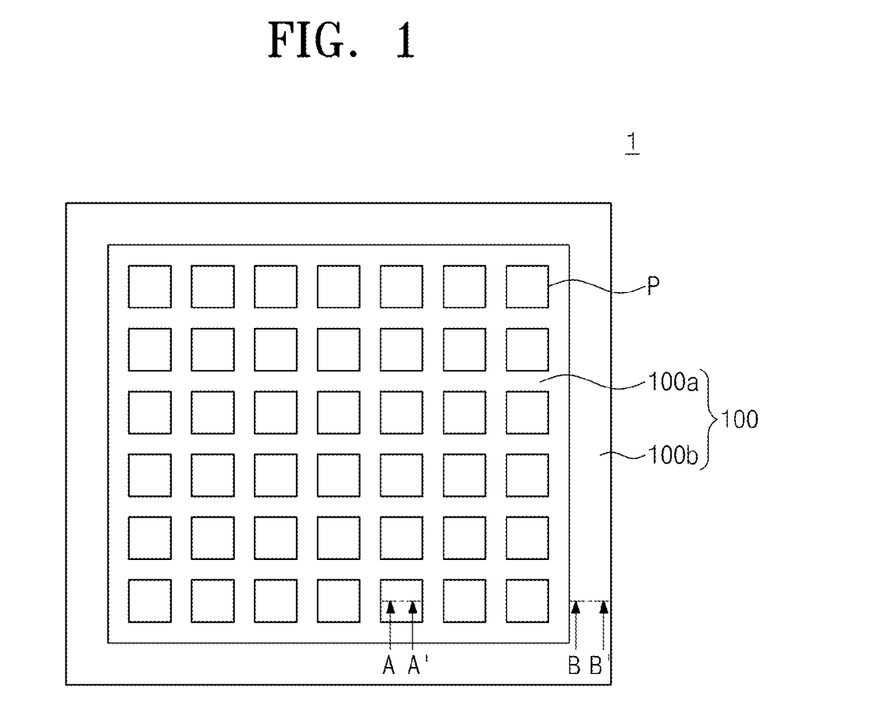
FIG. 1 is a plan view of a display device according to an embodiment of the present invention.

FIG. 1 is a plan view of a display device according to an embodiment of the present invention.

Referring to FIG. 1, a substrate 100 of a display device 1 may include a cell array area 100a and a peripheral circuit area 100b.

A plurality of pixels P that are arranged in a matrix form are disposed on the cell array area 100a. The cell array area 100a may be an area for realizing an image in the display device 1.

Control circuits (not shown) for controlling the pixels P of the cell array area 100a may be disposed on the peripheral circuit area 100b. For example, control circuits such as a row decoder, a column decoder, a timing generator, and an input/output buffer may be disposed on the peripheral circuit area 100b. In aspect of plan, the peripheral circuit area 100b may surround the cell array area 100a.

Figure 2:
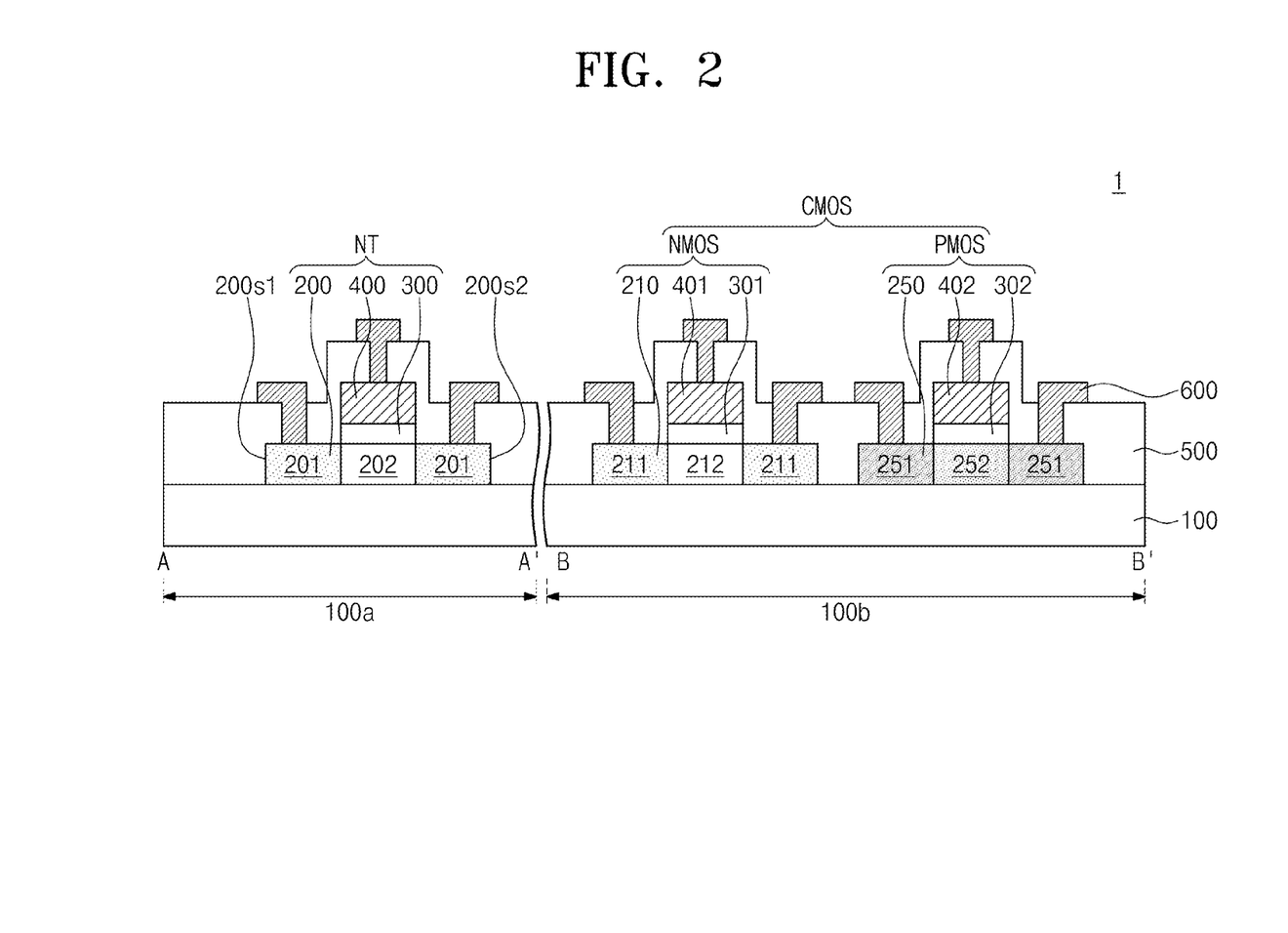
FIG. 2 is a cross-sectional view of the display device according to an embodiment of the present invention.

FIG. 2 is a cross-sectional view of the display device according to an embodiment of the present invention, taken along lines A-A' and B-B' of FIG. 1. Hereinafter, the duplicated descriptions, which have been described already, will be omitted.

Referring FIGS. 1 and 2, the display device 1 may include an n-type transistor NT and a complementary metal-oxide semiconductor (CMOS) transistor on the substrate 100. The substrate 100 may be a glass or flexible plastic substrate such as polyimide, polyehylene naphthalte, polycarbonate and polyethylene terephthalte. The substrate 100 may have the cell array area 100a and the peripheral circuit area 100b. The cell array area 100a and the peripheral circuit area 100b of the substrate 100 may be equal or similar to those of the substrate 100 of FIG. 1.

The n-type transistor NT may be disposed on the cell array area 100a of the substrate 100. For example, each of the pixels P may include at least one n-type transistor NT. As a cell oxide layer 200 of the n-type transistor NT disposed on the cell array area 100a includes metal oxide, the display device 1 may realize a high-definition image.

The cell oxide layer 200 may be disposed on the cell array area 100a of the substrate 100. For example, the cell oxide layer 200 may be metal oxide including at least one of Zn, In, Sn, and Ga. The cell oxide layer 200 may include source/drain parts 201 and a channel part 202. The source/drain parts 201 may extend from one side surface 200s1 and the other side surface 200s2 of the cell oxide layer 200, respectively. The channel part 202 may be disposed between the source/drain parts 201. The source/drain parts 201 may contain dopant such boron (B). As the source/drain parts 201 include metal oxide, boron (B) may serve as n-type dopant in the source/drain parts 201. For another example, the source/drain part 201 may have a hydrogen concentration greater than that of the channel part 202. When the transistor has a top-gate self-aligned structure, a cell gate 400 may serve as a mask when the transistor is fabricated. As a result, the source/drain parts 201 may not overlap the channel part 202. When the n-type transistor NT operates, parasitic resistance or parasitic capacitance may not occur to improve an operation speed of the n-type transistor NT.

A cell gate dielectric layer 300 may be disposed on the cell oxide layer 200 to cover the channel part 202 of the cell oxide layer 200. The cell gate dielectric layer 300 may include silicon oxide, silicon nitride, and a high-k material such as aluminum oxide, or hafnium oxide. The cell gate 400 may be disposed on the cell gate dielectric layer 300. The cell gate 400 may also include metal (for example, aluminum, molybdenium, titanium, copper) and/or transparent conductive oxide (for example, indium tin oxide (ITO) or indium zinc oxide (IZO)).

The CMOS transistor CMOS may be disposed on the peripheral circuit area 100b of the substrate 100. The CMOS transistor CMOS may include an NMOS transistor NMOS and a PMOS transistor PMOS, which are adjacent to each other. As the CMOS transistor CMOS is disposed on the peripheral circuit area 100b, the control circuits (not shown) disposed on the peripheral circuit area 100b may be highly integrated when compared to a structure in which only the NMOS transistor NMOS or only the PMOS transistor PMOS is disposed on the peripheral circuit area 100b. Also, the display device 1 may be reduced in power consumption. The NMOS transistor NMOS may have a structure that is equal or similar to the above-described n-type transistor NT.

A circuit oxide layer 210 may be disposed on the peripheral circuit area 100b of the substrate 100. The circuit oxide layer 210 may include the same material as the cell oxide layer 200. The circuit oxide layer 210 may have source/drain areas 211 and a channel area 212. The source/drain areas 211 may be disposed on positions that correspond to both ends of the circuit oxide layer 210, respectively. The channel area 212 may be disposed between the source/drain areas 211. The source/drain areas 211 may be an n-type conductive areas. Dopant contained in the source/drain areas 211 may be boron (B). As the source/drain areas 211 include metal oxide, boron (B) may serve as n-type dopant.

A first circuit gate dielectric layer 301 may be disposed on the circuit oxide layer 210 to cover the channel area 212. The first circuit gate dielectric layer 301 may have the same material as the cell gate dielectric layer 300 of the n-type transistor NT.

A first circuit gate 401 may be disposed on the first circuit gate dielectric layer 301. The first circuit gate 401 may have the same material as the cell gate 400 of the n-type transistor NT. The first circuit gate dielectric layer 301 and the first circuit gate 401 may not cover both ends of the circuit oxide layer 210, e.g., the source/drain areas 211.

The PMOS transistor PMOS may include a silicon layer 250, a second circuit gate dielectric layer 302, and a second circuit gate 402. The silicon layer 250 may be disposed n the peripheral circuit area 100b of the substrate 100. The silicon layer 250 may include polysilicon. The silicon layer 250 may have source/drain electrodes 251 and an active area 252. For example, both ends of the silicon layer 250 may correspond to the source/drain electrodes 251, respectively. The active area 252 may be disposed between the source/drain electrodes 251 to serve as a channel. The source/drain electrodes 251 may be p-type conductive electrodes. The source/drain electrode 251 of the PMOS transistor may include the same dopant as the source/drain areas 211 of the NMOS transistor NMOS. The dopant contained in the source/drain electrodes 251 may be the group III elements, for example, boron (B).

The second circuit gate dielectric layer 302 may be disposed on the silicon layer 250 to cover the active area 252. The gate dielectric layer may not cover both ends of the silicon layer 250, e.g., the source/drain electrodes 251. The second circuit gate dielectric layer 302 may have the same material as the first circuit gate dielectric layer 301.

The second circuit gate 402 may be disposed on the second circuit gate dielectric layer 302. The second circuit gate 402 may have the same material as the first circuit gate 401. The second circuit gate dielectric layer 302 and the second circuit gate 402 may not cover both ends of the silicon layer 250, e.g., the source/drain electrodes 251. The second circuit gate 402 may have the same material as the first circuit gate 402.

An interdielectric layer 500 may cover the substrate 100, the n-type transistor NT, and the CMOS transistor CMOS. Conductive lines 600 may be disposed on the interdielectric layer 500. The conductive lines 600 may pass through the interdielectric layer 500 to respectively contact each of the source/drain parts 201 and the cell gate 400 of the n-type transistor NT, the source/drain areas 211 and the first circuit gate 401 of the MOS transistor NMOS, and the source/drain electrodes 251 and the second circuit gate 402 of the PMOS transistor PMOS.

Figure 3:
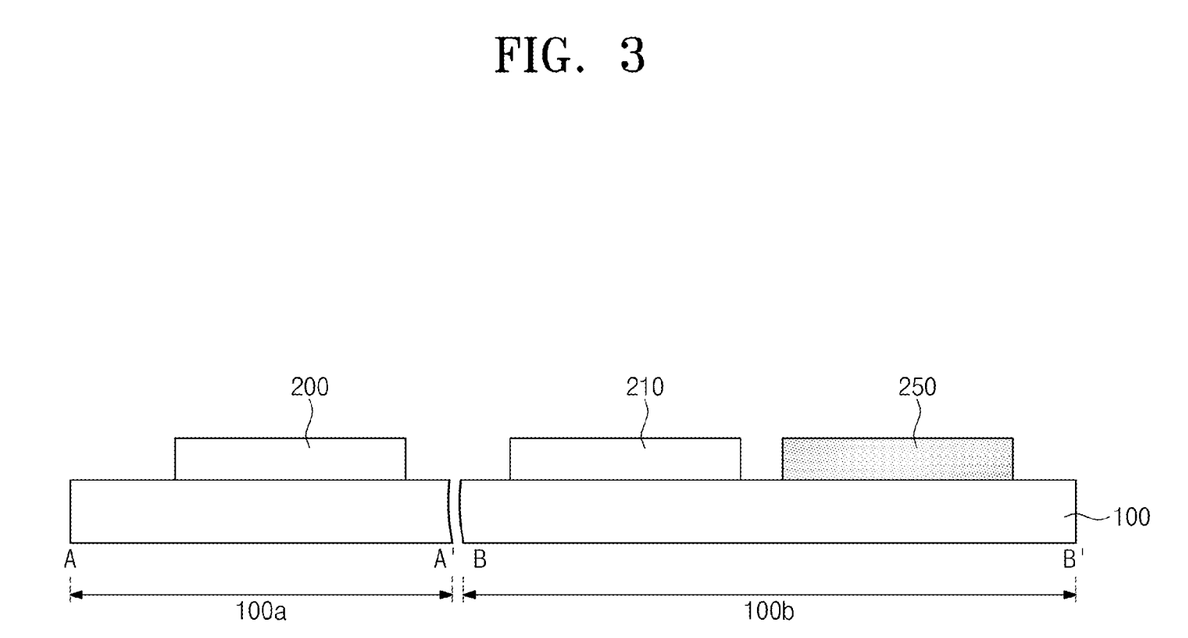
FIGS. 3 to 6 are cross-sectional views illustrating a process of fabricating the display device according to an embodiment of the present invention.
Figure 4:
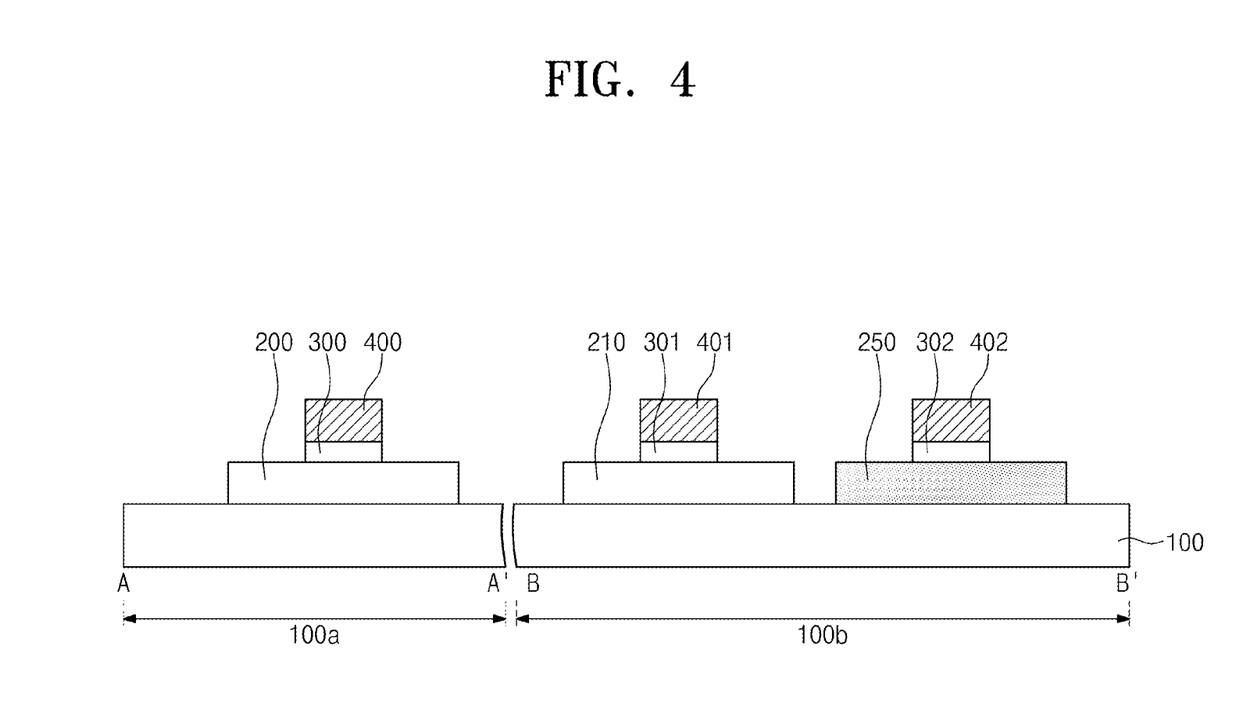
Figure 5:
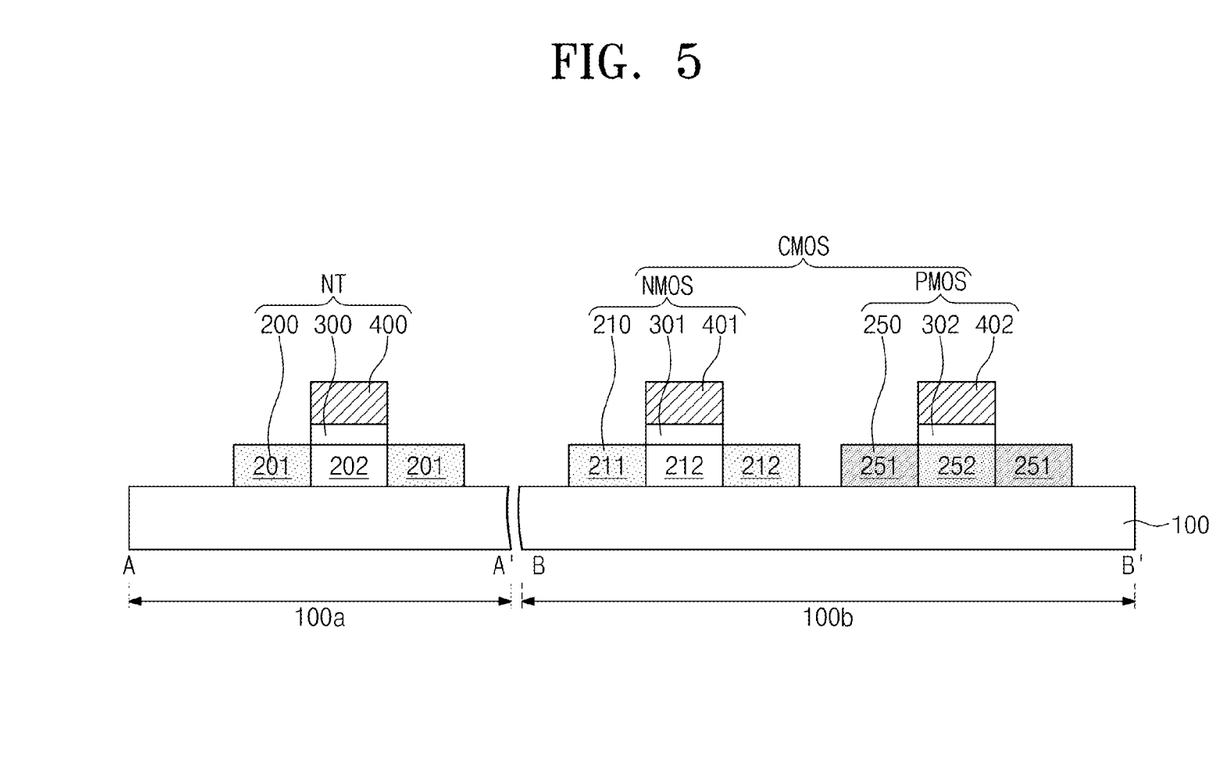

FIGS. 3 to 5 are cross-sectional views illustrating a process of fabricating the display device according to an embodiment of the present invention. Hereinafter, the duplicated descriptions, which have been described already, will be omitted.

Referring to FIGS. 1 and 3, a substrate 100 having a cell array area 100a and a peripheral circuit area 100b may be prepared.

A silicon layer 250 may be formed on the peripheral circuit area 100b of the substrate 100. The silicon layer 250 may include polysilicon. For example, the silicon layer 250 may be deposited by using a plasma enhanced chemical vapor deposition (PECVD) process. The silicon layer 250 may be patterned by using a photolithography process and an etching process. The silicon layer 250 may be removed from a cell array area 100a. A thermal processing process may be performed on the silicon layer 250 to cure the silicon layer 250. For example, the thermal processing process that is performed on the silicon layer 250 may be performed using a laser device. A crystallization process for the silicon layer 250 may be performed on only the peripheral circuit area 100b. According to the present invention, the silicon layer 250 may be more quickly fabricated when compared to a case in which the silicon layer 250 is formed on all of the cell array area 100a and the peripheral circuit area 100b.

Oxide layers 200 and 210 may be formed on the cell array area 100a and the peripheral circuit area 100b, respectively. The oxide layers 200 and 210 may be formed by using a sputtering, atomic layer deposition (ALD), solution spin coating, or solution printing process. The oxide layers 200 and 210 may include at least one of Zn, In, Sn, and Ga. The cell oxide layer 200 may be formed on the cell array area 100a of the substrate 100, and the circuit oxide layer 210 may be formed on the peripheral circuit area 100b. The cell oxide layer 200 may be formed together with the circuit oxide layer 210. The circuit oxide layer 210 and the silicon layer 250 may be provided in a pair. For example, the circuit oxide layer 210 may have the same number of the silicon layer 250. For example, after the crystallization process is performed on the silicon layer 250, the oxide layers 200 and 210 may be formed. Thus, the oxide layers 200 and 210 may not be damaged due to the crystallization process for the silicon layer 250.

Referring to FIG. 4, gate dielectric layers 300, 301, and 302 may be formed on the silicon layer 250 and the oxide layers 200 and 210, respectively. The cell gate dielectric layer 300 may be formed on the cell oxide layer 200 to expose both ends of the cell oxide 200. The first circuit gate dielectric layer 301 may be formed on the circuit oxide layer 210 to expose both ends of the circuit oxide layer 210. The second circuit gate dielectric layer 302 may be formed on the silicon layer 250 to expose both ends of the silicon layer 250. The first circuit gate dielectric layer 301 may be formed together with the cell gate dielectric layer 300 and the second circuit gate dielectric layer 302. The gate dielectric layers 300, 301, and 302 may include silicon oxide, silicon nitride and a high-k material such as aluminum oxide, or hafnium oxide.

A metal material may be deposited to respectively form gates 400, 401, and 402 on the gate dielectric layers 300, 301, and 302. For another example, the gate layers 400, 401, and 402 may include metal (for example, aluminum, molybdenium, titanium, copper) and low-resistant transparent conductive oxide such as indium tin oxide (ITO) or indium zinc oxide (IZO). The cell gate 400 may be formed on the cell gate dielectric layer 300. The first circuit gate 401 may be formed on the first circuit gate dielectric layer 301. The second circuit gate 402 may be formed on the second circuit gate dielectric layer 302. The first circuit gate 401 may be formed together with the cell gate 400 and the second circuit gate 402.

Referring to FIG. 5, a dopant injection process may be performed to form source/drain parts 201 of the cell oxide layer 200, source/drain areas 211 of the circuit oxide layer 210, and source/drain electrodes 252 of the silicon layer 250. For example, dopant may be injected into both ends of the silicon layer 250 and both ends of the metal oxide layers 200 and 210. The dopant injection process may be performed by using a gas (e.g., B$_2$H$_6$) containing boron (B) and a hydrogen gas. The dopant injection process may be performed by using an injection device or plasma doping device. The boron (B) injected into the silicon layer 250 may serve as p-type dopant. Thus, the source/drain electrodes 251 of a PMOS transistor PMOS may be formed. For example, boron (B) may be injected into both ends of the oxide layers 200 and 210. The boron (B) injected into the oxide layers 200 and 210 may serve as n-type dopant. Thus, the source/drain parts 201 of the n-type transistor NT and the source/drain areas 211 of the NMOS transistor NMOS may be formed. For another example, in the dopant injection process, hydrogen gas may be injected into each of both ends of the oxide layers 200 and 210. Thus, each of the source/drain parts 201 may have a concentration greater than that of a channel part 202, and each of the source/drain areas 211 may have a concentration greater than that of a channel area 212. According to the present invention, the source/drain areas 211 of the NMOS transistor NMOS may be formed together with the source/drain electrodes 251 of the PMOS transistor PMOS and the source/drain parts 201 of the n-type transistor NT. Thus, a separate n-type dopant injection process for forming the source/drain areas 211 of the NMOS transistor NMOS and the source/drain parts 201 of the n-type transistor NT may be omitted. Also, since the n-type dopant injection process and a p-type dopant injection process are performed at the same time, a photolithograph process for the n-type dopant injection process and a photolithograph process for the p-type dopant injection process may be omitted. Thus, the process of fabricating the transistors NT and CMOS may be simplified, and also, process time and costs may be reduced. The transistors NT and CMOS may be easily fabricated.

Figure 6:
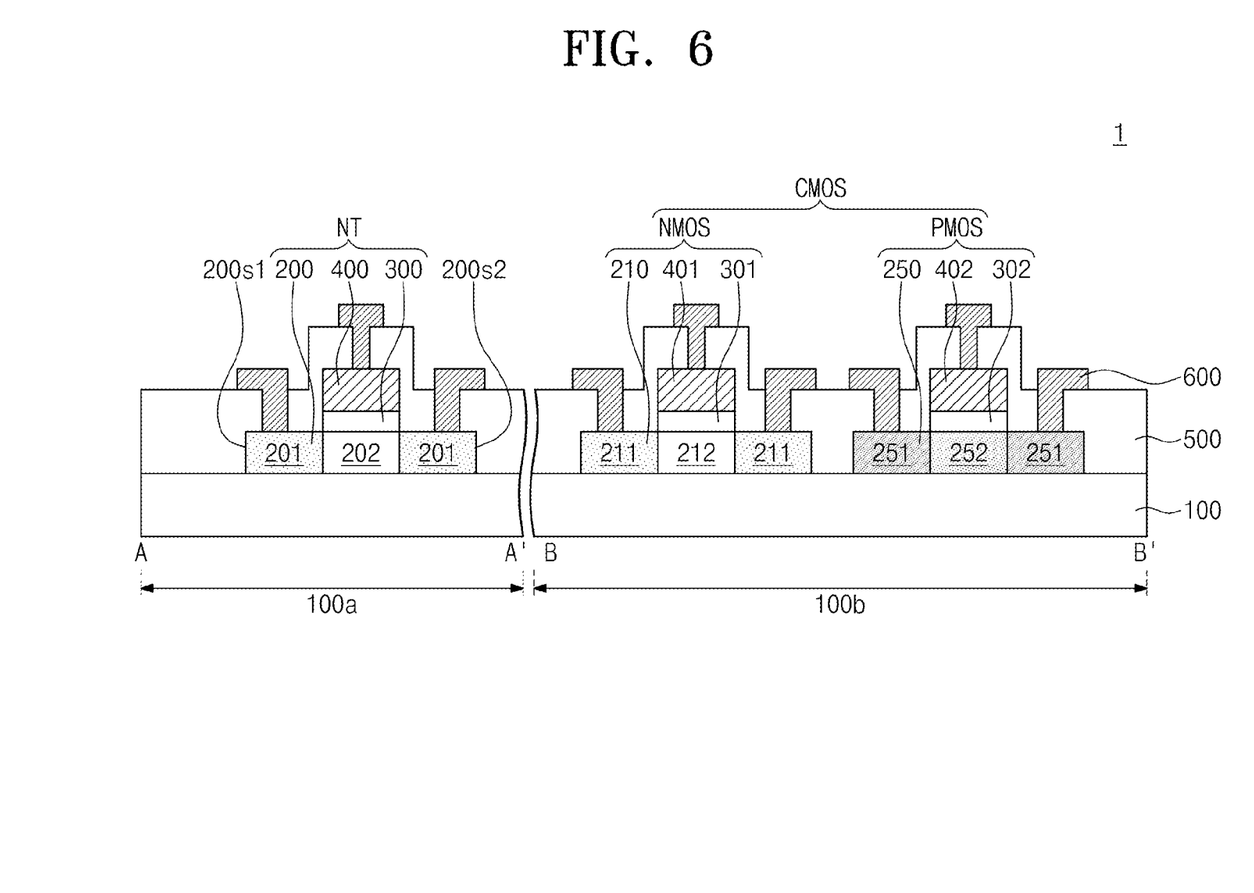

Referring to FIG. 6, an interdielectric layer 500 and conductive lines 600 may be formed. For example, an insulation material may be deposited on the substrate 100 to form the interdielectric layer 500. The interdielectric layer 500 may cover the substrate 100, the n-type transistor NT, and the CMOS transistor CMOS. The conductive lines 600 may be formed on the interdielectric layer 500. The conductive lines 600 may pass through the interdielectric layer 500 to respectively contact the source/drain parts 201 and cell gate 400 of the n-type transistor NT, the source/drain areas 211 and the first circuit gate 401 of the MOS transistor NMOS, and the source/drain electrodes 251 and the second circuit gate 402 of the PMOS transistor PMOS.

FIGS. 7 to 11 are cross-sectional views illustrating a process of an image sensor device according to an embodiment of the present invention. Hereinafter, the duplicated descriptions, which have been described already, will be omitted.

Figure 7:
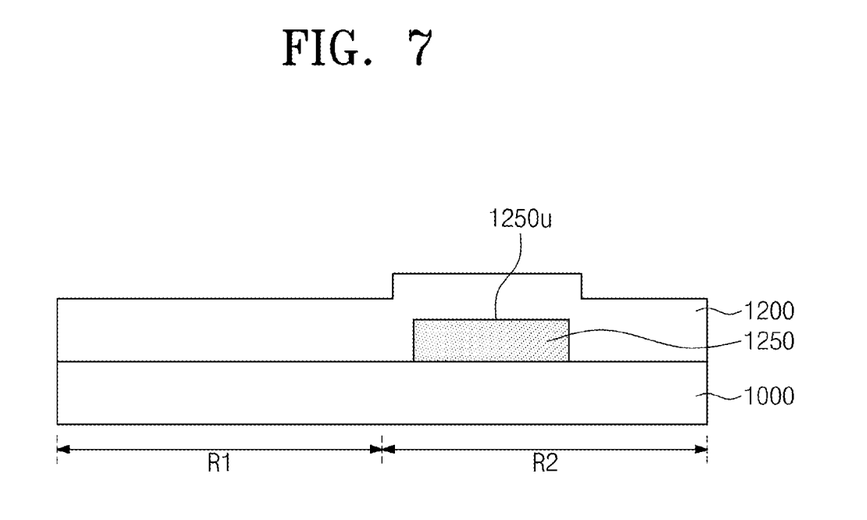
FIGS. 7 to 11 are cross-sectional views illustrating a process of an image sensor device according to an embodiment of the present invention.

Referring to FIG. 7, a silicon layer 1250 and an oxide layer 1200 may be formed on a substrate 1000. The substrate 1000 may have a first area R1 and a second area R2. The substrate 1000 may be a glass or flexible plastic substrate such as polyimide, polyehylene naphthalte, polycarbonate and polyethylene terephthalte. The silicon layer 1250 may be formed on a second area R2 of the substrate 1000. For example, the silicon layer 1250 may be formed by using a plasma enhanced chemical vapor deposition (PECVD) process. A thermal processing process may be performed on the silicon layer 1250 to cure the silicon layer 1250. The crystallization process for the silicon layer 1250 may be performed by using laser. The silicon layer 1250 may include polysilicon.

The oxide layer 1200 may be formed on the first and second areas R1 and R2 of the substrate 1000. The oxide layer 1200 may extend from the first area R1 of the substrate 1000 to a top surface 1250$u$ of the silicon layer 1250. The oxide layer 1200 may cover the top surface 1250$u$ of the silicon layer 1250. The oxide layer 1200 may be formed by using a sputtering, atomic layer deposition (ALD), solution spin coating, or solution printing process. The oxide layer 1200 may include an oxide semiconductor containing at least one of Zn, In, Sn, and Ga. The oxide layer 1200 may be transparent. After the silicon layer 1250 is formed, the oxide layer may be formed. Thus, the oxide layers 1200 and 210 may not be damaged due to the crystallization process for the oxide layer 1200.

Figure 8:
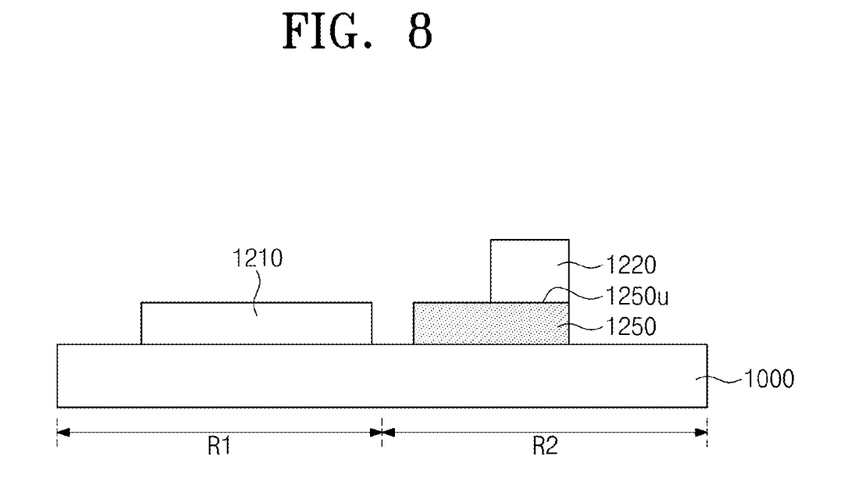

Referring to FIG. 8, the oxide layer (see reference numeral 1200 of FIG. 7) may be patterned to form a first oxide layer 1210 and a second oxide layer 1220. For example, the oxide layer 1200 may be patterned by using a photoresist process and an etching process. The first oxide layer 1210 may be formed on the first area R1 of the substrate 1000. The first oxide layer 1210 may be spaced apart from the second oxide layer 1220. The second oxide layer 1220 may be formed on the silicon layer 1250. The second oxide layer 1220 may expose one end of the top surface 1250$u$ of the silicon layer 1250.

Figure 9:
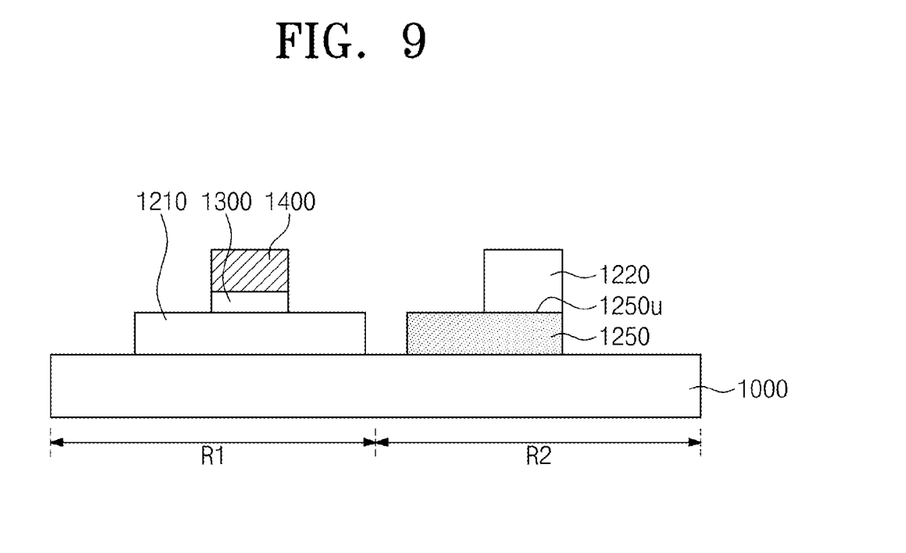

Referring to FIG. 9, a gate dielectric layer 1300 and a gate electrode 1400 may be successively formed on the first oxide layer 1210. The gate dielectric layer 1300 may include a high-k material such as silicon oxide, silicon nitride, aluminum oxide, or hafnium oxide. The gate electrode 1400 may be formed on the gate dielectric layer 1300. The gate electrode 1400 may include a metal. For another example, the gate electrode 1400 may include low-resistant transparent conductive oxide such as indium tin oxide (ITO) or indium zinc oxide (IZO). The gate dielectric layer 1300 and the gate electrode 1400 may not cover both ends of the first oxide layer 1210.

Figure 10:
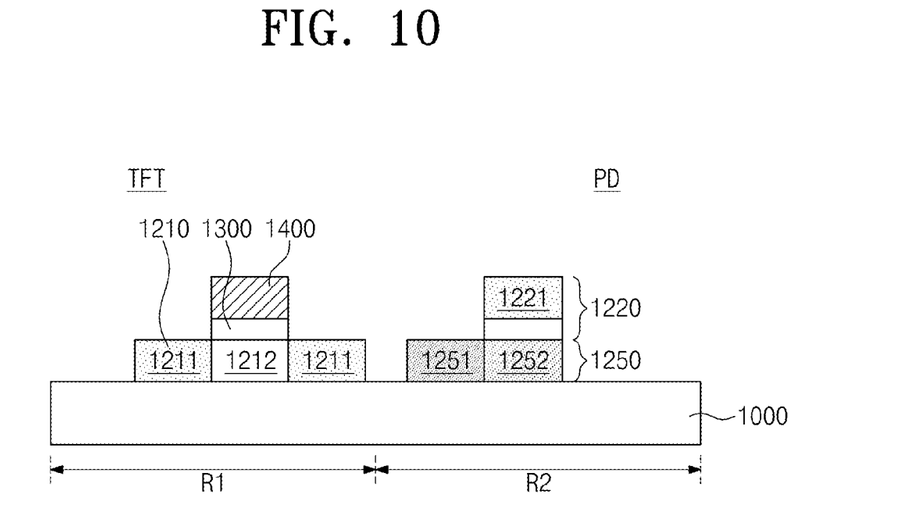

Referring to FIG. 10, dopant may be injected to form source/drain areas 1211, an n-type dopant area 1221, and a p-type dopant area 1251. For example, the dopant may be injected into both ends of the first oxide layer 1210, an upper portion of the second oxide layer 1220, and one end of the silicon layer 1250. The dopant injection process may be performed by using a boron-containing gas (e.g., $B_2H_6$) or hydrogen gas. The source/drain areas 1211 may be formed on both ends of the first oxide layer 1210 by the dopant injection process. The channel area 1212 may be disposed between the source/drain areas 1211. The boron (B) may serve as n-type dopant within the first oxide layer 1210. As a result, a transistor TFT may be formed on the first area R1 of the substrate 1000. The transistor TFT may be an n-type transistor.

An n-type dopant area 1221 may be formed on an upper portion of the second oxide layer 1220 by the dopant injection process. A lower portion of the second oxide layer 1220 may not be doped with boron (B). The n-type dopant area 1221 and the source/drain area 1211 of the transistor TFT may be formed at the same time. A p-type dopant area 1251 may be formed on one end of the silicon layer 1250 by the dopant injection process. The other end of the silicon layer 1250 may not be doped. The other end of the silicon layer 1250 may correspond to an intrinsic silicon area 1252. Thus, a photodiode PD may be formed on the second area R2 of the substrate 1000.

The p-type dopant area 1251 may include the same dopant, e.g., boron (B) as the n-type dopant area 1221. The boron (B) injected into the silicon layer 1250 may serve as p-type dopant, the boron (B) injected into the oxide layers 1210 and 1220 may serve as n-type dopant. Thus, the p-type dopant area 1251 may be formed by the same ion injection process as the n-type dopant area 1221 and source/drain areas 1211. The dopant injection process may be performed by using an injection device or plasma doping device. A separate dopant injection process for forming the n-type dopant area 1221 and the source/drain areas 1211 may be omitted.

For another example, the hydrogen used in the dopant injection process may be injected into both ends of the first oxide layer 1210 and an upper portion of the second oxide layer 1220. As the hydrogen contained in the oxide layer 1200 increases in concentration, free electrons within the oxide layer 1200 may increase in concentration. The dopant injection process may be performed by using an injection device or plasma doping device. The source/drain areas 1211 and the n-type dopant area 1221 may be easily formed by using the hydrogen gas.

Hereinafter, the photodiode PD will be described.

The silicon layer 1250 may easily sense light of a visible light region. The second oxide layer 1220 may be sensitive to short wavelength light such as ultraviolet light region. Since the photodiode PD of the present invention includes the silicon layer 1250 and the second oxide layer 1220, light (for example, visible light, ultraviolet light and infrared light) of various regions may be effectively sensed. According to the present invention, the second oxide layer 1220 may be disposed on the silicon layer 1250. The second oxide layer 1220 may be transparent than the silicon layer 1250. Light incident from the outside may be transmitted through the second oxide layer 1220 and then be incident into the other end 1252 of the silicon layer 1250. Thus, the photodiode PD according to the present invention may more sensitively sense the external light when compared to a structure in which the silicon layer 1250 is disposed on the second oxide layer 1220.

Figure 11:
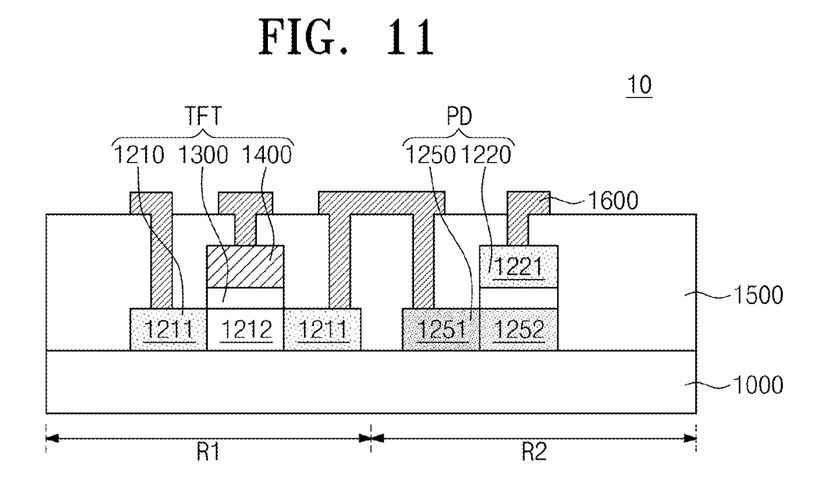

Referring to FIG. 11, an interdielectric layer 1500 and conductive lines 1600 may be formed on a substrate 1000. For example, the interdielectric layer 1500 may cover the transistor TFT and the photodiode PD on the substrate 1000. The conductive lines 1600 may be disposed on the interdielectric layer 1500. The conductive lines 1600 may pass through the interdielectric layer 1500 and then be electrically connected to each of the transistor TFT and the photodiode PD. For example, the conductive lines may contact each of the source/drain areas 1211 and the gate electrode 1400 of the transistor TFT, the p-type dopant area 1251 of the photodiode PD, and the n-type dopant area 1221 of the photodiode PD, respectively. Thus, the fabrication of the image sensor device 10 may be completed.

Figure 12:
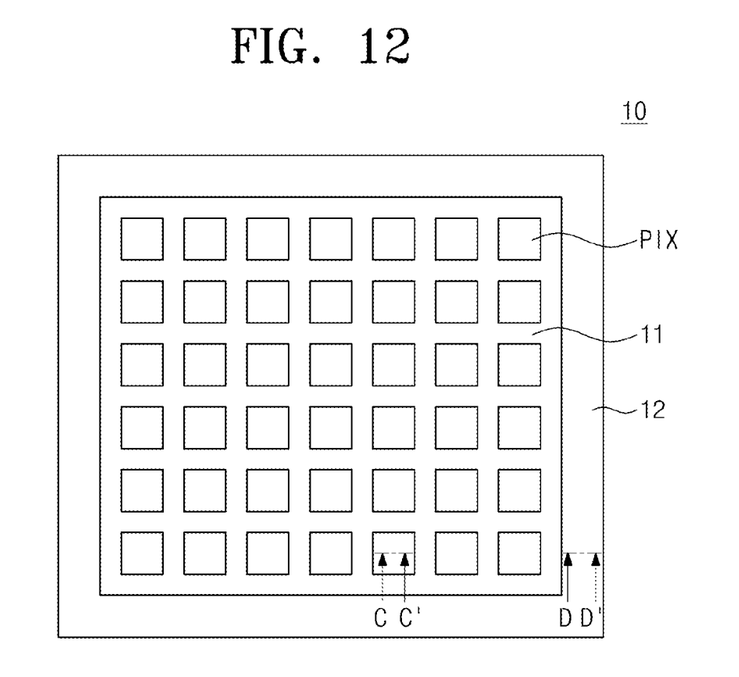
FIG. 12 is a plan view of the image sensor device fabricated according to an embodiment of the present invention.
Figure 13:
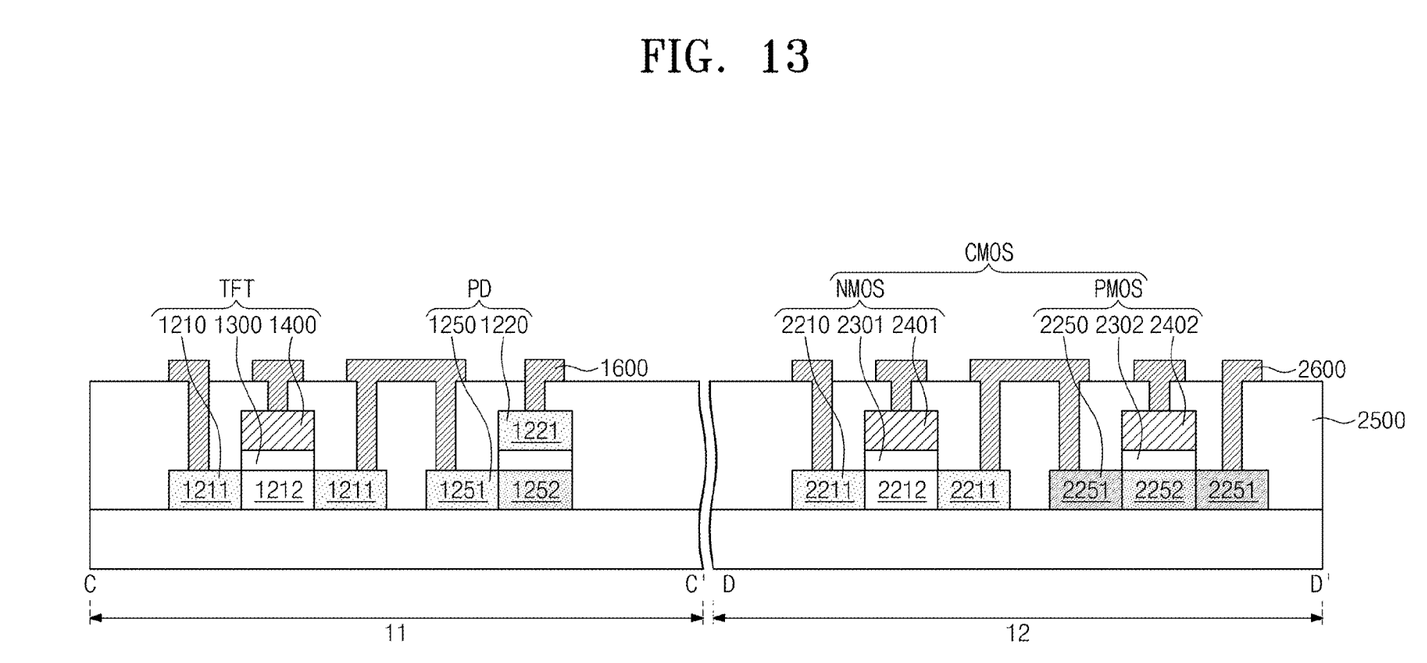
FIG. 13 is a cross-sectional view of the image sensor device according to an embodiment of the present invention.

FIG. 12 is a plan view of the image sensor device fabricated according to an embodiment. FIG. 13 is a cross-sectional view of the display device according to an embodiment of the present invention, taken along lines A-A' and B-B' of FIG. 12. Hereinafter, the duplicated descriptions, which have been described already, will be omitted.

Referring to FIGS. 12 and 13, an image sensor device 10 may have a cell array area 11 and a peripheral circuit area 12.

An electrical signal generated by incident light may be outputted from the sensor array area 11. The sensor array area 11 may include a plurality of unit pixels PIX that are arranged in a matrix form. A control circuit area 12 may include control circuits (not shown) for controlling the unit pixels PIX of the sensor array area 11. An electrical signal may be generated from each of the unit pixels PIX by the incident light. Also, the electrical signal converted into each of the unit pixels PIX may be provided into the control signals (not shown). Each of the unit pixels PIX may include the transistor TFT and the photodiode PD, which are fabricated as examples in FIGS. 7 to 11. The transistor TFT and the photodiode may be fabricated as examples in FIGS. 7 to 11.

A CMOS transistor CMOS may be disposed on the peripheral circuit area 12. The CMOS transistor CMOS may include an NMOS transistor NMOS and a PMOS transistor PMOS, which are adjacent to each other. As the CMOS transistor CMOS is disposed on the peripheral circuit area 12, the control circuits (not shown) disposed on the peripheral circuit area 12 may be highly integrated when compared to a structure in which only the NMOS transistor NMOS or only the PMOS transistor PMOS is disposed on the peripheral circuit area 12. Also, the image sensor device 10 may be reduced in power consumption. The CMOS transistor CMOS may be fabricated though a method that is equal or similar to that for fabricating the CMOS transistor CMOS in FIGS. 3 to 6.

The NMOS transistor NMOS may include a circuit oxide layer 2210, a first circuit gate dielectric layer 2301, and a first circuit gate 2401. The circuit oxide layer 2210, the first circuit gate dielectric layer 2301, and the first circuit gate 2401 may be equal or similar to the circuit oxide layer 210, the first circuit gate dielectric layer 301, and the first circuit gate 401, which are described as examples in FIGS. 1 and 2, respectively. For example, the circuit oxide layer 2210 may have source/drain areas 2211 and a channel area 2212. The source/drain areas 2211 may be doped with n-type dopant. The dopant contained in the source/drain areas 2211 may be boron (B) A first circuit gate dielectric layer 2301 may be disposed on the circuit oxide layer 2210 to cover the channel area 2212. A first circuit gate 2401 may be disposed on the first circuit gate dielectric layer 2301.

A PMOS transistor PMOS may include a silicon layer 2250, a second circuit gate dielectric layer 2302, and a second circuit gate 2402. The silicon layer 2250, the second circuit gate dielectric layer 2302, and the second circuit gate 2402 may be equal or similar to the silicon layer 250, the second circuit gate dielectric layer 302, and the second circuit gate 402, which are described examples in FIGS. 1 and 2, respectively. The silicon layer 2250 may include polysilicon. The silicon layer 2250 may have source/drain electrodes 2251 and an active area 2252. For example, both ends of the silicon layer 2250 may correspond to the source/drain electrodes 2251, respectively. The source/drain electrodes 2251 may be doped with p-type dopant. The source/drain electrode 2251 of the PMOS transistor may include the same dopant as the source/drain areas 2211 of the NMOS transistor NMOS. The dopant contained in the source/drain electrodes 2251 may be the group III elements, for example, boron (B).

The second circuit gate dielectric layer 2302 may be disposed on the silicon layer 2250 to cover the active area 2252. The second circuit gate dielectric layer 2302 may have the same material as the first circuit gate dielectric layer 2301.

The second circuit gate 2402 may be disposed on the second circuit gate dielectric layer 2302. The second circuit gate 2402 may have the same material as the first circuit gate 2401. The second circuit gate 2402 may have the same material as the first circuit gate 2401.

An interdielectric layer 2500 may cover the CMOS transistor CMOS. Conductive lines 2600 may be disposed on the interdielectric layer 2500. The conductive lines 2600 may pass through the interdielectric layer 2500 to respectively contact the source/drain parts 2211 and the first circuit gate 2401 of the NMOS transistor NMOS and the source/drain electrodes 2251 and the second circuit gate 2402 of the PMOS transistor PMOS.

According to the concept of the present invention, the metal oxide layer may be doped together with the silicon layer. In the doping process, the boron-containing gas and hydrogen-containing gas may be used. Due to the doping process, the metal oxide layer may have the n-type conductive property, and the silicon layer may have the p-type conductive property. Thus, the display device and the image sensor device may be easily fabricated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
a substrate comprising a cell array area and a peripheral area;
an n-type transistor disposed on the cell array area of the substrate, wherein the n-type transistor comprises a cell oxide layer including source/drain parts and a channel part; and
a CMOS transistor disposed on the peripheral area of the substrate,
wherein the CMOS transistor comprises:
an NMOS transistor comprising a circuit oxide layer, a first circuit gate dielectric layer disposed on the circuit oxide layer, and a first circuit gate electrode disposed on the first circuit gate dielectric layer; and
a PMOS transistor comprising a silicon layer, a second circuit gate dielectric layer disposed on the silicon layer, and a second circuit gate electrode disposed on the second circuit gate dielectric layer,
wherein:
the cell oxide layer of the n-type transistor comprises metal oxide;
the circuit oxide layer of the NMOS transistor comprises metal oxide;
the silicon layer of the PMOS transistor comprises silicon;
the circuit oxide layer of the NMOS transistor comprises an n-type dopant, and the silicon layer of the PMOS transistor comprises a p-type dopant; and
the n-type dopant of the NMOS transistor is same as the p-type dopant of the PMOS transistor.

2. The display device of claim 1, further comprising:
an interdielectric layer disposed on the substrate to cover the silicon layer, the circuit oxide layer, the cell oxide layer, and the gate electrode; and
conductive lines disposed on the interdielectric layer to respectively contact both ends of the circuit oxide layer, both ends of the silicon layer, the first circuit gate electrode, and the second circuit gate electrode.

3. The display device of claim 1, wherein:
the cell array area is a pixel area in which a plurality of pixels are arranged in a matrix form; and
the CMOS transistor is disposed on the peripheral area of the substrate outside the pixel area.

4. The display device of claim 1, wherein both of the n-type dopant of the NMOS transistor and the p-type dopant of the PMOS transistor comprise boron (B).

5. A display device comprising:
a substrate comprising a cell array area and a peripheral area;
an n-type transistor disposed on the cell array area of the substrate; and
a CMOS transistor disposed on the peripheral area of the substrate,
wherein the CMOS transistor comprises:
an NMOS transistor comprising a circuit oxide layer, a first circuit gate dielectric layer disposed on the circuit oxide layer, and a first circuit gate electrode disposed on the first circuit gate dielectric layer; and
a PMOS transistor comprising a silicon layer, a second circuit gate dielectric layer disposed on the silicon layer, and a second circuit gate electrode disposed on the second circuit gate dielectric layer,
wherein:
the circuit oxide layer comprises source/drain areas and a channel area;
the silicon layer comprises source/drain electrodes and an active area;
the source/drain areas of the circuit oxide layer of the NMOS transistor comprise an n-type dopant, and the source/drain electrodes of the silicon layer of the PMOS transistor comprise a p-type dopant; and
the n-type dopant of the NMOS transistor is same as the p-type dopant of the PMOS transistor.

6. The display device of claim 5, wherein the n-type transistor comprises a cell oxide layer comprising source/drain parts and a channel part, a cell gate dielectric layer disposed on the cell oxide layer, and a cell gate electrode disposed on the cell gate dielectric layer, and
the cell oxide layer comprises the same material as the circuit oxide layer.

7. The display device of claim 6, wherein the cell oxide layer comprises a metal oxide including at least one of Zn, In, Sn, and Ga.

8. The display device of claim 6, wherein the cell gate dielectric layer comprises the same material as the first circuit gate dielectric layer and the second circuit gate dielectric layer, and
the cell gate electrode comprises the same material as the first circuit gate electrode and the second circuit gate electrode.

9. The display device of claim 5, wherein both of the n-type dopant and the p-type dopant comprise boron (B).

10. The display device of claim 5, wherein:
the cell array area is a pixel area in which a plurality of pixels are arranged in a matrix form; and
the CMOS transistor is disposed on the peripheral area of the substrate outside the pixel area.

11. The display device of claim 5, wherein the circuit oxide layer comprises metal oxide.

12. The display device of claim 5, wherein the NMOS transistor is laterally disposed with the PMOS transistor in a plan view.

* * * * *